United States Patent
Bae et al.

(10) Patent No.: US 8,039,275 B1
(45) Date of Patent: Oct. 18, 2011

(54) INTEGRATED CIRCUIT PACKAGING SYSTEM WITH ROUNDED INTERCONNECT AND METHOD OF MANUFACTURE THEREOF

(75) Inventors: JoHyun Bae, Seoul (KR); DaeSik Choi, Seoul (KR); SungWon Cho, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/792,629

(22) Filed: Jun. 2, 2010

(51) Int. Cl.
*H01L 21/66* (2006.01)

(52) U.S. Cl. .................................. 438/15; 257/737

(58) Field of Classification Search .............. 257/377, 257/737, 774, E33.056, E33.059, E23.001, 257/E23.141–E23.178, E21.627, E21.641; 438/15, 25, 26, 51, 55, 64, 106–127
See application file for complete search history.

(56) References Cited

U.S. PATENT DOCUMENTS

| 7,345,361 | B2 | 3/2008 | Mallik et al. |
| 2007/0158806 | A1 | 7/2007 | Kwon et al. |
| 2007/0190690 | A1 * | 8/2007 | Chow et al. ............. 438/113 |
| 2008/0230887 | A1 | 9/2008 | Sun et al. |
| 2009/0236726 | A1 | 9/2009 | Retuta et al. |
| 2010/0289134 | A1 * | 11/2010 | Chow et al. ............. 257/692 |

OTHER PUBLICATIONS

U.S. Appl. No. 12/560,312, filed Sep. 15, 2009, Jang et al.
U.S. Appl. No. 12/730,989, filed Mar. 24, 2010, Bae et al.

* cited by examiner

*Primary Examiner* — A. Sefer
*Assistant Examiner* — Monica D Harrison
(74) *Attorney, Agent, or Firm* — Mikio Ishimaru

(57) ABSTRACT

A method of manufacture of an integrated circuit packaging system includes: forming a rounded interconnect on a package carrier having an integrated circuit attached thereto; placing a mold chase having a protrusion over the rounded interconnect; forming an encapsulation over the package carrier, the encapsulation having a recess under the protrusion; removing the mold chase to expose the encapsulation; and removing the encapsulation under the recess for exposing the rounded interconnect.

10 Claims, 3 Drawing Sheets

INTEGRATED CIRCUIT PACKAGING SYSTEM WITH ROUNDED INTERCONNECT AND METHOD OF MANUFACTURE THEREOF

TECHNICAL FIELD

The present invention relates generally to an integrated circuit packaging system, and more particularly to a system for an integrated circuit packaging system with encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection and space savings. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a rounded interconnect on a package carrier having an integrated circuit attached thereto; placing a mold chase having a protrusion over the rounded interconnect; forming an encapsulation over the package carrier, the encapsulation having a recess under the protrusion; removing the mold chase to expose the encapsulation; and removing the encapsulation under the recess for exposing the rounded interconnect.

The present invention provides an integrated circuit packaging system, including: a package carrier; an integrated circuit attached to the package carrier; a rounded interconnect on the package carrier; and an encapsulation over the package carrier covering the integrated circuit and exposing the rounded interconnect having a characteristic that is free of denting.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
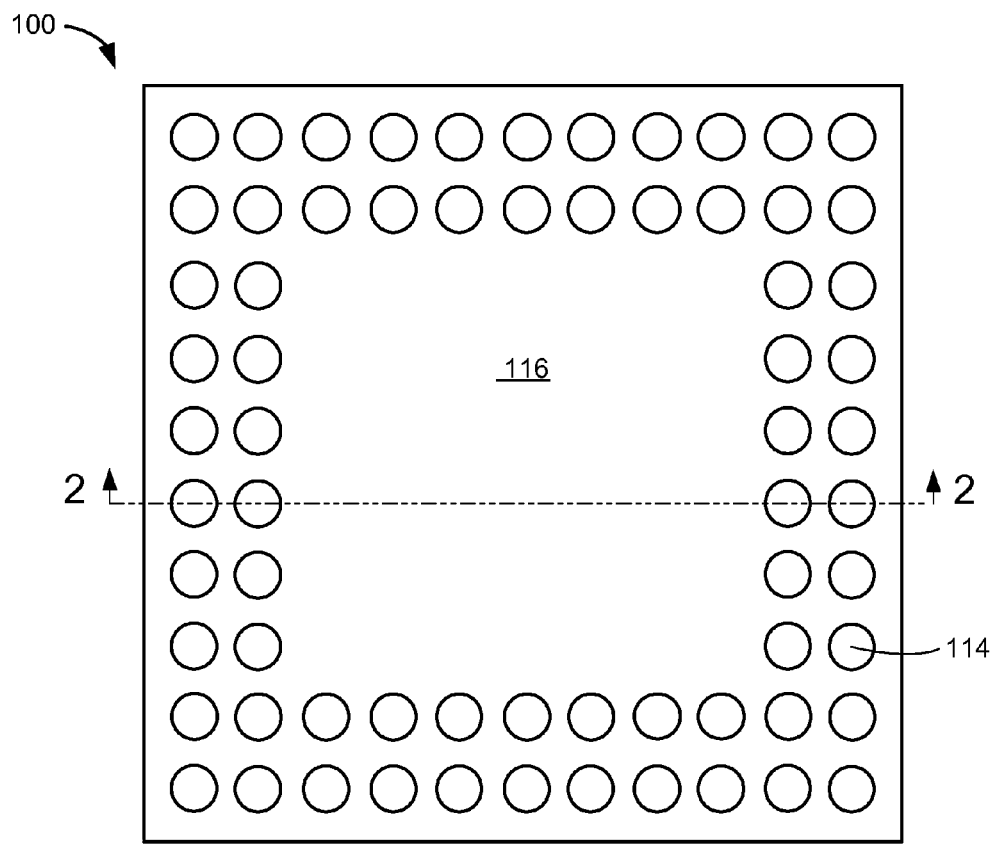
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 can have a configuration of a packaging system with a package ablation method for Molded Laser Package-on-Package (MLP).

The integrated circuit packaging system 100 can include a rounded interconnect 114, which provides electrical connectivity to external systems mounted thereon. The rounded interconnect 114 can be more specifically a conductive bump, a conductive ball, a conductive post, a conductive pillar, or a conductive connector. The rounded interconnect 114 can be formed with solder, a metallic alloy, or a conductive material. The rounded interconnect 114 can be formed in a peripheral array.

The rounded interconnect 114 can be exposed from an encapsulation 116, defined as a cover of a semiconductor package that seals electrical components and provides mechanical and environmental protection. The encapsulation 116 can be a cover including an epoxy molding compound or a molding material.

Figure 2:
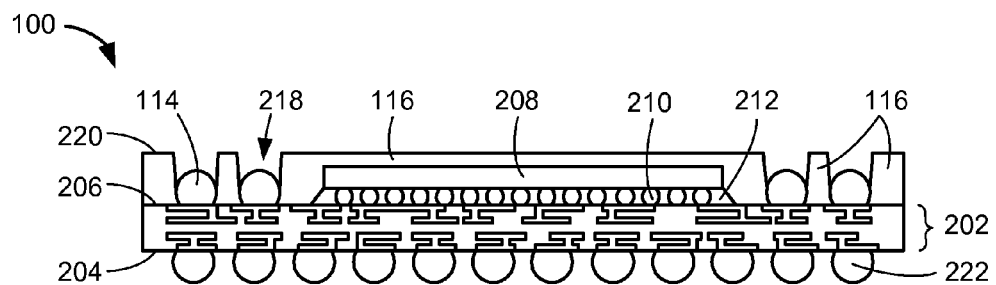
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a package carrier 202. The package carrier 202 is for mounting and connecting devices and integrated circuits as part of a finished product to be used in a system.

The package carrier 202 can be a substrate, a leadframe, or a printed circuit board (PCB). The package carrier 202 can have a bottom side 204 and a top side 206 at an opposing side to the bottom side 204.

An integrated circuit 208, more specifically a flip-chip, an integrated circuit die, a semiconductor device, or a chip, can be mounted over the top side 206. An internal interconnect 210, more specifically a conductive ball, a conductive bump, a wire, or an electrical connector, can be electrically connected to the top side 206 and the integrated circuit 208. The internal interconnect 210 can be formed with solder, a metallic alloy, or a conductive material.

The integrated circuit 208 can be attached to the top side 206 with the internal interconnect 210. An underfill 212, more specifically an epoxy resin or any underfill resin material, can be dispensed in a space between the top side 206 and the integrated circuit 208 to protect the internal interconnect 210.

The rounded interconnect 114 can be attached and electrically connected to the top side 206. The rounded interconnect 114 can be formed in multiple rows adjacent to a non-horizontal side of the package carrier 202. The rounded interconnect 114 can be mounted adjacent to the integrated circuit 208. The integrated circuit 208 can be surrounded by the rounded interconnect 114.

For example, the rounded interconnect 114 can be a post. Also for example, the rounded interconnect 114 can have a curved surface facing away from the package carrier 202 and a non-curved surface facing the package carrier 202.

The encapsulation 116 can be formed over the top side 206 covering the integrated circuit 208 and the underfill 212. The encapsulation 116 can partially cover the rounded interconnect 114. The encapsulation 116 can include an opening 218, more specifically a hole or a cavity. The rounded interconnect 114 can be partially exposed within the opening 218.

A top surface 220 of the encapsulation 116 can be above the rounded interconnect 114. The encapsulation 116 can isolate the rounded interconnect 114 from a further placement of the rounded interconnect 114.

An external interconnect 222, more specifically a conductive ball, a conductive bump, or a conductive connector, can be attached to the bottom side 204 to provide electrical connectivity to external systems (not shown). The external interconnect 222 can be formed with solder, a metallic alloy, or a conductive material.

Figure 3:
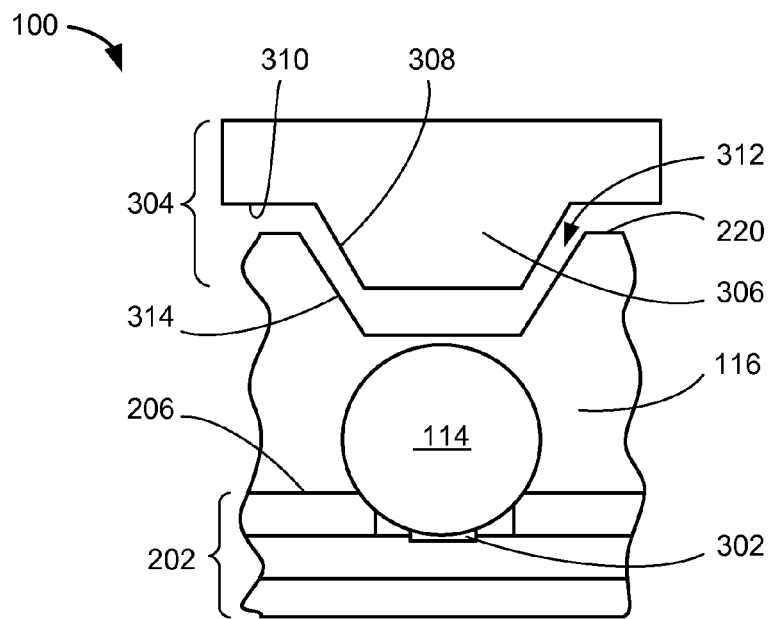
FIG. 3 is a cross-sectional view of a portion of the integrated circuit packaging system along a section line 2-2 of FIG. 1 in a molding phase of manufacture.

Referring now to FIG. 3, therein is shown a cross-sectional view of a portion of the integrated circuit packaging system 100 along a section line 2-2 of FIG. 1 in a molding phase of manufacture. The package carrier 202 can include a carrier pad 302, more specifically a terminal, a lead, or a contact.

The carrier pad 302 can be exposed at the top side 206. The rounded interconnect 114 can be formed on the top side 206 of the package carrier 202. The rounded interconnect 114 can be mounted on the carrier pad 302.

The integrated circuit packaging system 100 can include a mold chase 304, defined as an equipment or a device that is used to form a protective cover encapsulating semiconductor components. The mold chase 304 can be placed over the package carrier 202 and the rounded interconnect 114.

The mold chase 304 can include a protrusion 306. The mold chase 304 can be placed with the protrusion 306 over the rounded interconnect 114. The protrusion 306 can have a protrusion sidewall 308 that outwardly extends from a chase surface 310 of the mold chase 304. The protrusion sidewall 308 can be at an obtuse angle relative to the chase surface 310.

Although not shown, the mold chase 304 can include a support structure to hold the mold chase 304 up so that the protrusion 306 is over the rounded interconnect 114 when forming the encapsulation 116. For example, the support structure can be a post.

The encapsulation 116 can be formed with the mold chase 304. The encapsulation 116 can be formed over the package carrier 202. The encapsulation 116 can be formed between the top side 206 and the chase surface 310 to cover the rounded interconnect 114. With the protrusion 306 not directly on the rounded interconnect 114, the encapsulation 116 can be formed between the rounded interconnect 114 and the protrusion 306.

The encapsulation 116 can be formed with a recess 312 with the mold chase 304 having the protrusion 306 placed over the rounded interconnect 114. The recess 312 can be under the protrusion 306 and over the rounded interconnect 114.

The mold chase 304 can have an error range of approximately less than 5 micrometers (microns). The error range is defined as a height tolerance of the mold chase 304 for molding the encapsulation 116.

There can be an approximate alignment between the protrusion 306 and the rounded interconnect 114. The approximate alignment is defined as a vertical line that intersects a center of the protrusion 306 close to another vertical line that intersects a center of the rounded interconnect 114.

The approximate alignment can be based on an alignment of the mold chase 304 and a pin hole of the package carrier 202. With the protrusion 306 approximately aligned with the rounded interconnect 114, the recess 312 can be approximately aligned with the rounded interconnect 114.

The recess 312 can be bounded by a recess sidewall 314, defined as a side of the encapsulation 116 formed by the protrusion sidewall 308. The recess sidewall 314 can be at an obtuse angle relative to the top surface 220.

A manufacturing curing step can be performed to solidify or harden the encapsulation 116. The cross-sectional view depicts a manufacturing separation step of the mold chase 304 and the encapsulation 116. In the manufacturing separation step, the mold chase 304 can be removed to expose the encapsulation 116.

The manufacturing separation step can release the mold chase 304 from the encapsulation 116 or vice versa. The manufacturing separation step can occur after the manufacturing curing step. With the protrusion sidewall 308 and the recess sidewall 314 at obtuse angles relative to the chase surface 310 and the top surface 220, respectively, the manufacturing separation step can be facilitated.

The encapsulation 116 can have a characteristic of being formed with the mold chase 304. The characteristic of being formed with the mold chase 304 can include a physical feature, such as a mark or an imprint within a surface of the encapsulation 116. For example, the mold chase 304 can form an impression within the top surface 220 of the encapsulation 116.

Figure 4:
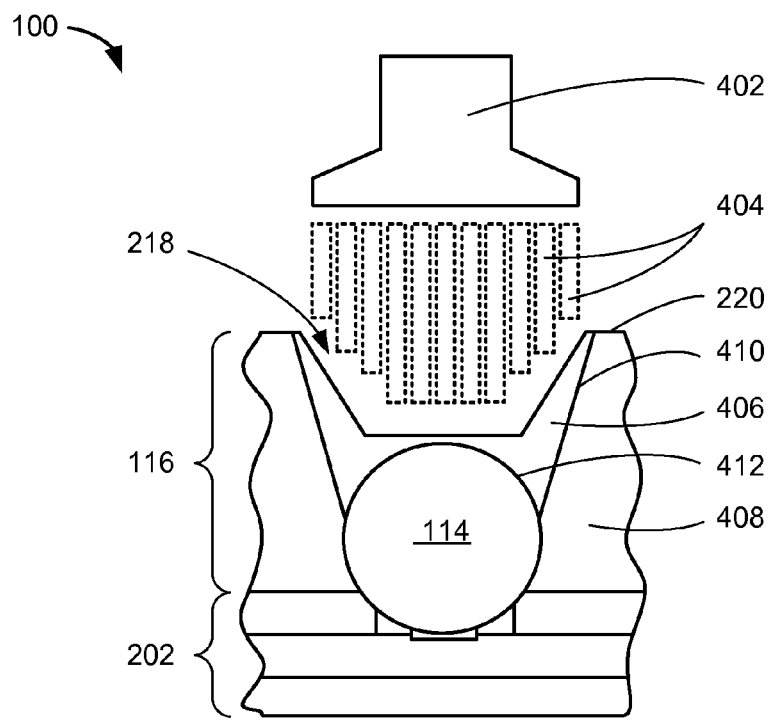
FIG. 4 is the structure of FIG. 3 in an ablation phase.

Referring now to FIG. 4, therein is shown the structure of FIG. 3 in an ablation phase. An ablation tool 402, defined as an equipment or a system that removes a portion of the encapsulation 116, can be used in the ablation phase. A laser ablation method can be used in the ablation phase. The ablation tool 402 can emit a laser beam 404, defined as an electromagnetic radiation generated from a light source.

The ablation tool 402 can produce the laser beam 404 of any number. For illustrative purposes, the laser beam 404 is shown as a dash rectangle. The laser beam 404 can include various types of laser. The laser beam 404 can be predetermined based on laser energy, exposure time, and laser characteristics.

For example, the laser beam 404 can include ultraviolet (UV), infrared (IR), Green, yttrium aluminum garnet (YAG), neodymium-doped YAG (Nd—YAG), or carbon dioxide (CO2). Also for example, the laser beam 404 can be a narrow laser beam with a narrow beam width.

The ablation tool 402 can be positioned above the recess 312 of FIG. 3 of the encapsulation 116. A removed portion 406 of the encapsulation 116 can be removed with the ablation tool 402. The removed portion 406 is more specifically a portion or an area of the encapsulation 116 ablated under the recess 312. The ablation tool 402 can be used to remove the removed portion 406.

The laser beam 404 can remove the removed portion 406, leaving a remaining portion 408 of the encapsulation 116 having the opening 218. The remaining portion 408 can partially expose the rounded interconnect 114 within the opening 218 of the remaining portion 408.

The opening 218 can be different from the recess 312. The recess 312 can be a result of the encapsulation 116 formed by the protrusion 306 of FIG. 3 after the molding phase. The opening 218 can be a result of the removed portion 406 removed under the recess 312 by the ablation tool 402 after the ablation phase.

The opening 218 can be bounded by an opening sidewall 410, defined as a side of the remaining portion 408 formed by the ablation tool 402. The opening sidewall 410 can be at an obtuse angle relative to the top surface 220.

An exposed surface 412 of the rounded interconnect 114 can be exposed from the encapsulation 116. The exposed surface 412 can be exposed within the opening 218. The opening sidewall 410 can be around a portion of the rounded interconnect 114. The opening sidewall 410 can be around the exposed surface 412.

The ablation tool 402 can remove the removed portion 406 within the recess 312. The ablation tool 402 can be approximately aligned with the recess 312 to form the opening sidewall 410. As such, the opening sidewall 410 can be approximately aligned with the rounded interconnect 114. The opening sidewall 410 approximately aligned with the rounded interconnect 114 means a vertical line intersecting a center of the opening 218 bounded by the opening sidewall 410 is close to another vertical line intersecting a center of the rounded interconnect 114.

The opening sidewall 410 can be formed based on a fiducial mark (not shown). The fiducial mark is a physical feature that is used as a reference point to identify a location or a position.

The fiducial mark can be used to identify a location of the recess 312. With the fiducial mark, the ablation tool 402 can identify the location of the recess 312 with improved location accuracy.

For example, the fiducial mark can be formed by etching, drilling, or laser scribing. Also for example, the fiducial mark of any number can be formed.

The fiducial mark can be formed on the encapsulation 116 or the package carrier 202. For example, the fiducial mark of any number can be formed on the encapsulation 116 within the recess 312.

The rounded interconnect 114 can have a characteristic of being exposed with the encapsulation 116 partially ablated by the ablation tool 402. The characteristic of being exposed with the encapsulation 116 partially ablated by the ablation tool 402 can include a physical feature that is free of denting, chipping, and mold flashing.

The physical feature can also include less laser-ablated marks and more consistent alignment compared to multiple-pass ablation methods. The laser-ablated marks can be less due to a single pass using the ablation tool 402 compared to the multiple-pass ablation methods. Consistent alignment can occur due to the ablation tool 402 approximately aligned with the recess 312 when forming the opening sidewall 410, whereas the multiple-pass ablation methods need further laser alignment.

The opening sidewall 410 can have a characteristic of being formed with the encapsulation 116 partially ablated by the ablation tool 402. The characteristic of being formed with the encapsulation 116 partially ablated by the ablation tool 402 can include a physical feature, such as a shallow cavity, a recess, a micro recess, a laser-ablated mark, or other removal marks. As an example, the laser-ablated mark can include an engraved mark or other laser markings.

With a combination of the molding phase and the ablation phase, manufacture time and cost can be reduced. Without the recess 312, the removed portion 406 can have more ablation area to be removed between the rounded interconnect 114 and the top surface 220. With the recess 312, the removed portion 406 can have less or narrow ablation area to be removed above the rounded interconnect 114, resulting in reduction of the manufacture time and cost.

It has been discovered that the integrated circuit packaging system 100 improves yield. The mold chase 304 of FIG. 3 having the protrusion 306 is approximately aligned with the rounded interconnect 114. With such an approximate alignment, the encapsulation 116 is formed with the recess 312 approximately aligned with the rounded interconnect 114. The encapsulation 116 is partially removed with the ablation tool 402 within the recess 312 to partially expose the rounded interconnect 114, thereby improving units per hour (UPH) and the yield.

It has also been discovered that the integrated circuit packaging system 100 improves reliability. In conventional encapsulation methods, an encapsulation material in minute gaps or spacing between a solder ball and a mold chase assembly thereon can cause a resin bleed problem. As a result, contamination can occur and affect Z-interconnection (also known as vertical interconnection) between the solder ball and an interconnect of a packaging system attached thereon. With the ablation tool 402, the removed portion 406 is ablated exposing the exposed surface 412 without any portion of the encapsulation 116 thereon, thereby improving the reliability.

Figure 5:
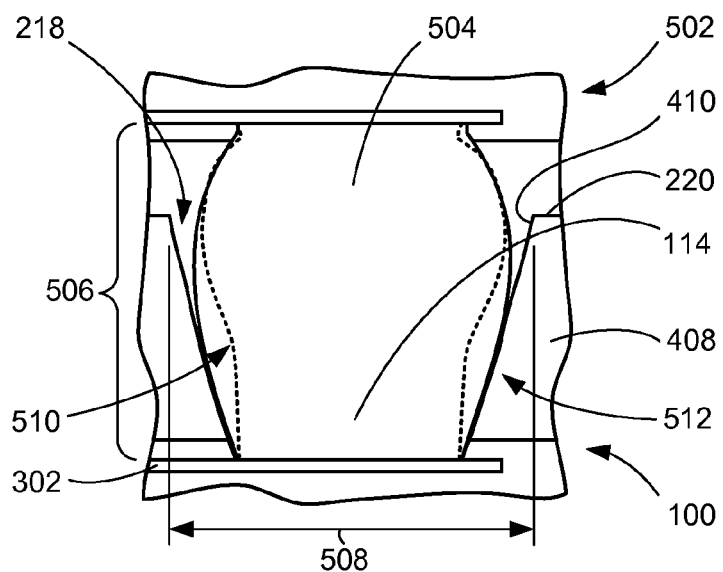
FIG. 5 is a detailed view of a portion of the structure of FIG. 4 with an attachment of a stack packaging system.

Referring now to FIG. 5, therein is shown a detailed view of a portion of the structure of FIG. 4 with an attachment of a stack packaging system 502. The stack packaging system 502 is an external system that includes a semiconductor package, a component, or a chip.

The stack packaging system 502 can include a stack interconnect 504, more specifically a conductive ball, a conductive bump, or a conductive connector. The stack interconnect 504 can be formed with solder, a metallic alloy, or a conductive material.

The stack packaging system 502 can be mounted over the integrated circuit packaging system 100. The stack interconnect 504 can be mounted over and attached to the rounded interconnect 114.

A stacking joint 506, defined as a conductive connection, can be formed between the integrated circuit packaging system 100 and the stack packaging system 502. The stacking joint 506 can be attached to the integrated circuit packaging system 100 and the stack packaging system 502 with the rounded interconnect 114 connected to the stack interconnect 504 within the opening 218. For illustrative purposes, the stacking joint 506 is shown after a reflow process of the rounded interconnect 114 and the stack interconnect 504 mounted thereon.

The remaining portion 408 can have the opening sidewall 410 at the obtuse angle relative to the top surface 220. The opening 218, bounded by the opening sidewall 410, can have a hole size 508. The hole size 508 can decrease as the opening sidewall 410 extends from the top surface 220 towards a bottom portion of the remaining portion 408. The hole size 508 can be determined based on spacing required for the stacking joint 506 to form without manufacturing defects.

For example, the manufacturing defects can be associated with soldering processes. Also for example, the manufacturing defect can be a snowman defect. As its name implies, the snowman defect has a structure of a conductive joint having a contour that resembles that of a snowman.

In other words, the snowman defect can be a structure with a bottom conductive portion, a top conductive portion, and a narrow conductive portion 510, defined as a part connecting the bottom conductive portion and the top conductive portion. The narrow conductive portion 510 can lack mechanical strength to provide a robust physical connection.

The snowman defect can also be known as a snowman failure, a snowman solder joint, or a head in pillow defect. The snowman defect, as shown by dash curves, can arise in conventional encapsulation methods having a mold chase assembly mounted on a solder ball to form a package encapsulation.

The stacking joint 506 can be formed with a robust structure that has mechanical strength to withstand physical shock. The stacking joint 506 can have a wider structure than that with the narrow conductive portion 510 in the snowman defect. With the wider structure, the stacking joint 506 can have a lower portion 512 in contact with the opening sidewall 410. The lower portion 512 can be connected to the carrier pad 302.

It has been discovered that the integrated circuit packaging system 100 further improves the reliability. The snowman defect is eliminated resulting in the stacking joint 506 having the wider structure than the narrow conductive portion 510 in the snowman defect, thereby further improving the reliability.

Figure 6:
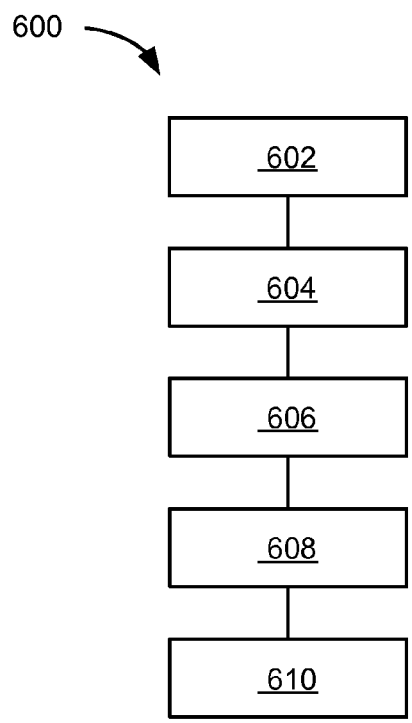
FIG. 6 is a flow chart of a method of manufacture of the integrated circuit packaging system in a further embodiment of the present invention.

Referring now to FIG. 6, therein is shown a flow chart of a method 600 of manufacture of the integrated circuit packaging system 100 in a further embodiment of the present invention. The method 600 includes: forming a rounded interconnect on a package carrier having an integrated circuit attached thereto in a block 602; placing a mold chase having a protrusion over the rounded interconnect in a block 604; forming an encapsulation over the package carrier, the encapsulation having a recess under the protrusion in a block 606; removing the mold chase to expose the encapsulation in a block 608; and removing the encapsulation under the recess for exposing the rounded interconnect in a block 610.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a rounded interconnect on a package carrier having an integrated circuit attached thereto;
   placing a mold chase having a protrusion over the rounded interconnect;
   forming an encapsulation over the package carrier, the encapsulation having a recess under the protrusion;
   removing the mold chase to expose the encapsulation; and removing the encapsulation under the recess for exposing the rounded interconnect.

2. The method as claimed in claim 1 wherein removing the encapsulation includes ablating the encapsulation under the recess.

3. The method as claimed in claim 1 wherein removing the encapsulation includes removing the encapsulation under the recess leaving the encapsulation having an opening exposing the rounded interconnect.

4. The method as claimed in claim 1 wherein removing the encapsulation includes removing the encapsulation under the recess leaving the encapsulation having a top surface, an opening sidewall, and an opening bounded thereby, the opening sidewall at an obtuse angle relative to the top surface and the opening exposing the rounded interconnect.

5. The method as claimed in claim 1 wherein:
   removing the encapsulation includes removing the encapsulation under the recess leaving the encapsulation having an opening sidewall; and
further comprising:
   forming a stacking joint having a lower portion in contact with the opening sidewall.

6. A method of manufacture of an integrated circuit packaging system comprising:
   forming a rounded interconnect on a package carrier having an integrated circuit attached thereto;
   placing a mold chase having a protrusion over the rounded interconnect;
   forming an encapsulation over the package carrier, the encapsulation having a recess under the protrusion, the encapsulation having a top surface above the rounded interconnect;
   removing the mold chase to expose the encapsulation; and
   removing the encapsulation under the recess for exposing the rounded interconnect.

7. The method as claimed in claim 6 wherein removing the encapsulation includes ablating the encapsulation under the recess, the encapsulation having a laser-ablated mark.

8. The method as claimed in claim 6 wherein forming the encapsulation includes forming the encapsulation over the package carrier, the encapsulation having the top surface above the rounded interconnect, the top surface having a characteristic of being formed with the mold chase.

9. The method as claimed in claim 6 wherein forming the rounded interconnect includes forming a conductive bump on the package carrier.

10. The method as claimed in claim 6 wherein forming the rounded interconnect includes forming the rounded interconnect on a substrate having the integrated circuit attached thereto.

* * * * *